(12) United States Patent
Dede et al.

(10) Patent No.: US 8,730,674 B2
(45) Date of Patent: May 20, 2014

(54) MAGNETIC FLUID COOLING DEVICES AND POWER ELECTRONICS ASSEMBLIES

(75) Inventors: Ercan Mehmet Dede, Ann Arbor, MI (US); Jaewook Lee, Ann Arbor, MI (US); Tsuyoshi Nomura, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 224 days.

(21) Appl. No.: 13/316,954

(22) Filed: Dec. 12, 2011

(65) Prior Publication Data

US 2013/0148301 A1 Jun. 13, 2013

(51) Int. Cl.
*H05K 7/20* (2006.01)

(52) U.S. Cl.
USPC ........... 361/702; 361/688; 361/699; 361/703; 361/704; 361/707; 165/80.4; 257/713; 257/714

(58) Field of Classification Search
None
See application file for complete search history.

(56) References Cited

U.S. PATENT DOCUMENTS

| | | | |
|---|---|---|---|
| 4,884,168 A | | 11/1989 | August et al. |
| 5,462,685 A | * | 10/1995 | Raj et al. ..................... 252/62.56 |
| 6,019,165 A | * | 2/2000 | Batchelder ................... 165/80.3 |
| 6,191,945 B1 | | 2/2001 | Belady et al. |
| 6,351,381 B1 | | 2/2002 | Bilski et al. |
| 6,366,461 B1 | | 4/2002 | Pautsch et al. |
| 6,431,260 B1 | | 8/2002 | Agonafer et al. |
| 6,819,561 B2 | | 11/2004 | Hartzell et al. |
| 6,927,510 B1 | * | 8/2005 | Beitelman et al. ............... 310/54 |
| 7,011,143 B2 | | 3/2006 | Corrado et al. |
| 7,135,246 B2 | * | 11/2006 | Motoyama et al. ........... 429/434 |
| 7,252,139 B2 | | 8/2007 | Novotny et al. |
| 7,298,617 B2 | | 11/2007 | Campbell et al. |
| 7,306,027 B2 | | 12/2007 | Whitney et al. |
| 7,340,904 B2 | * | 3/2008 | Sauciuc et al. .................... 62/3.2 |
| 7,598,646 B2 | * | 10/2009 | Cleveland ................ 310/156.43 |
| 7,751,918 B2 | | 7/2010 | Campbell et al. |
| 8,430,531 B2 | * | 4/2013 | Catalano ........................ 362/294 |
| 2006/0278373 A1 | * | 12/2006 | Hsu ........................... 165/104.33 |

FOREIGN PATENT DOCUMENTS

EP 856 A1 * 2/1979 ............. H01L 23/36

OTHER PUBLICATIONS

J.C. Boulware, S. Jenson, "Thermomagnetic siphoning on a bundle of current-carrying wires", COMSOL Conference 2010.
T. Strek, "Heat transfer in ferrofluid in channel with porous walls", COMSOL Conference, 2006.
H. Ozoe, Magnetic Convection, Imperial College Press, 2005.
Vincent Biancomano, "Inverters fight for traction", Energy Efficiency & Technology, Jul. 1, 2011.

* cited by examiner

*Primary Examiner* — Boris Chervinsky
(74) *Attorney, Agent, or Firm* — Dinsmore & Shohl LLP

(57) ABSTRACT

Magnetic fluid cooling devices and power electronic devices are disclosed. In one embodiment, a magnetic fluid cooling device includes a magnetic field generating device, a magnetic fluid chamber assembly, and a heat sink device. The magnetic field generating device includes a plurality of magnetic regions having alternating magnetic directions such that magnetic flux generated by the magnetic field generating device is enhanced on a first side of the magnetic field generating device and inhibited on a second side of the magnetic field generating device. The magnetic fluid chamber assembly defines a magnetic fluid chamber configured to receive magnetic fluid. The heat sink device includes a plurality of extending fins, and is thermally coupled to the magnetic fluid chamber assembly. Power electronic devices are also disclosed, wherein the magnetic fluid chamber may be configured as opened or closed.

20 Claims, 9 Drawing Sheets

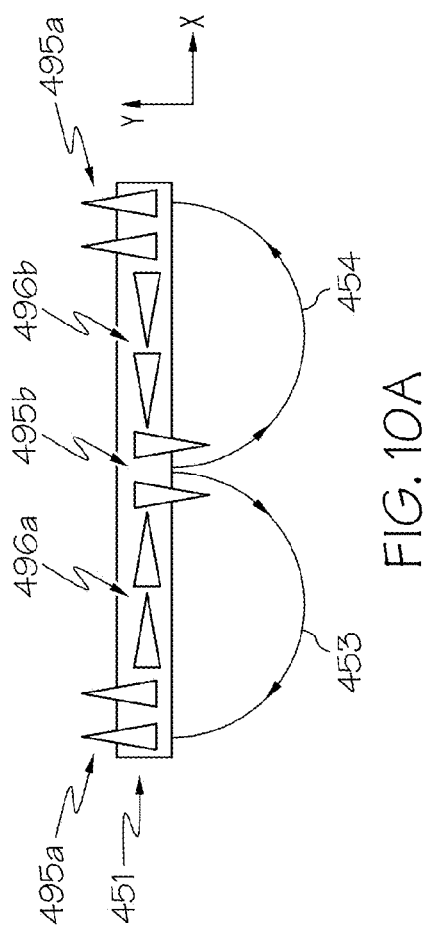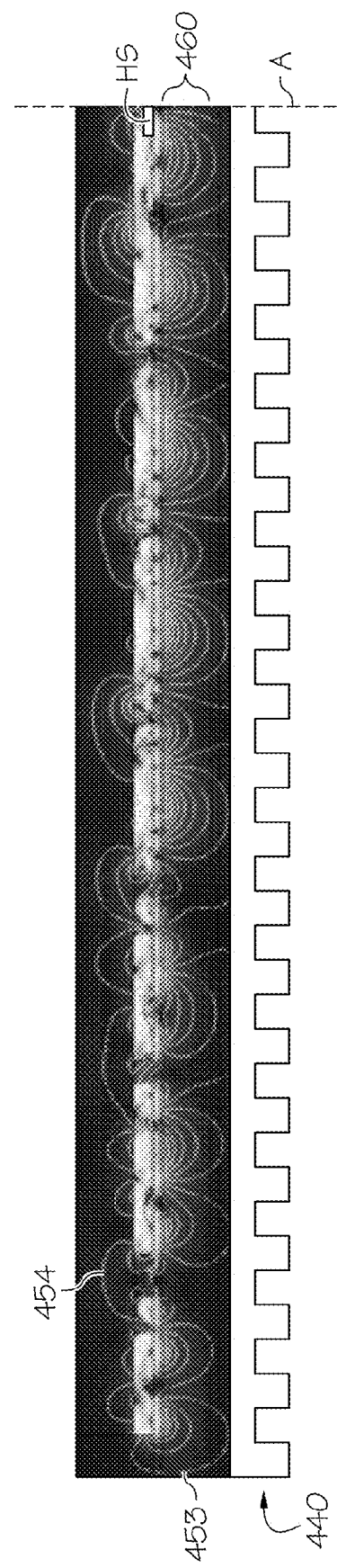
FIG. 10A
FIG. 10B

MAGNETIC FLUID COOLING DEVICES AND POWER ELECTRONICS ASSEMBLIES

TECHNICAL FIELD

The present specification generally relates to power electronics assemblies, and more particularly, to magnetic fluid cooling devices and power electronics assemblies that use a magnetic fluid for thermal management.

BACKGROUND

Power electronics devices are often utilized in high-power electrical applications, such as inverter systems for hybrid electric vehicles and electric vehicles. Power semiconductor devices such as power IGBTs and power transistors, for example, may be thermally coupled to a cooling structure, such as a liquid-cooled cold plate and/or heat sink, to remove non-uniform heat fluxes generated by the power semiconductor devices. Operation of the power semiconductor devices may generate high thermal loads. Current and future power semiconductor devices demand increased thermal management performance of cooling structures.

Accordingly, a need exists for alternative power electronics assemblies that optimize thermal performance of cooling structures to remove non-uniform heat fluxes generated by heat generating structures, such as semiconductor devices.

SUMMARY

In one embodiment, a magnetic fluid cooling device includes a magnetic field generating device, a magnetic fluid chamber assembly, and a heat sink device. The magnetic field generating device is configured to generate a magnetic field and includes a plurality of magnetic regions having alternating magnetic directions such that magnetic flux generated by the magnetic field generating device is enhanced on a first side of the magnetic field generating device and inhibited on a second side of the magnetic field generating device. The magnetic fluid chamber assembly defines a magnetic fluid chamber that is configured to accept a magnetic fluid such that the magnetic fluid flows within the magnetic fluid chamber. The first side of the magnetic field generating device is coupled to the magnetic fluid chamber assembly. The heat sink device includes a plurality of extending fins, and is thermally coupled to the magnetic fluid chamber assembly. The magnetic field generating device is positioned and configured such that the magnetic field generated by the magnetic field generating device manipulates a flow of the magnetic fluid within the magnetic fluid chamber by thermo-magnetic convection, thereby disrupting a natural thermal boundary within the magnetic fluid chamber resulting from a heat flux applied to the magnetic fluid chamber.

In another embodiment, a power electronics assembly includes a semiconductor assembly including a semiconductor device, a magnetic field generating device configured to generate a magnetic field, a magnetic fluid chamber assembly, and a heat sink device. The magnetic fluid chamber assembly defines a magnetic fluid chamber that is configured to accept a magnetic fluid such that the magnetic fluid flows within the magnetic fluid chamber. The magnetic fluid chamber assembly is thermally coupled to the semiconductor assembly. The heat sink device includes a plurality of extending fins and is thermally coupled to the magnetic fluid chamber assembly. The magnetic field generating device is positioned and configured such that the magnetic field generated by the magnetic field generating device manipulates a flow of the magnetic fluid within the magnetic fluid chamber by thermo-magnetic convection, thereby disrupting a natural thermal boundary within the magnetic fluid chamber resulting from a heat flux generated by the semiconductor assembly.

In yet another embodiment, a power electronics assembly includes a semiconductor assembly including a semiconductor device, a magnetic field generating device configured to generate a magnetic field, and a heat sink device. The heat sink device includes a magnetic fluid chamber, a thermal coupling surface, and a plurality of extending fins. The magnetic fluid chamber is configured to accept a magnetic fluid such that the magnetic fluid flows within the magnetic fluid chamber. The semiconductor assembly is thermally coupled to the heat sink device, and the magnetic field generating device is positioned and configured such that the magnetic field generated by the magnetic field generating device manipulates a flow of the magnetic fluid within the magnetic fluid chamber by thermo-magnetic convection, thereby disrupting a natural thermal boundary within the magnetic fluid chamber resulting from a heat flux generated by the semiconductor assembly.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 10A schematically depicts a magnetic field generating device configured as a Halbach array according to one or more embodiments shown and described herein;

FIG. 10B schematically depicts a simulated magnetic field distribution of a plurality of magnetic field generating devices configured as Halbach arrays within a power electronics assembly according to one or more embodiments shown and described herein;

DETAILED DESCRIPTION

Referring generally to the appended figures, embodiments of the present disclosure are directed to power electronics assemblies and vehicles that utilize a magnetic field to disrupt thermal boundary layers that may develop within coolant fluid located in a fluid chamber. Embodiments utilize a magnetic fluid in a thermo-magnetic cooling system to reduce the temperature field due to non-uniform heat flux. More particularly, embodiments comprise a magnetic fluid chamber through which a magnetic fluid flows, and one or more magnetic field generating devices capable of generating one or more magnetic fields that disrupt the flow of the magnetic fluid and therefore preventing, disrupting and/or altering natural fluid and thermal boundary layers within the magnetic fluid. Disruption of the fluid and thermal boundary layers increases the performance of the cooling structure of the power electronics assembly. Various embodiments of magnetic fluid cooling devices and power electronic assemblies will be described in more detail herein.

Figure 1:
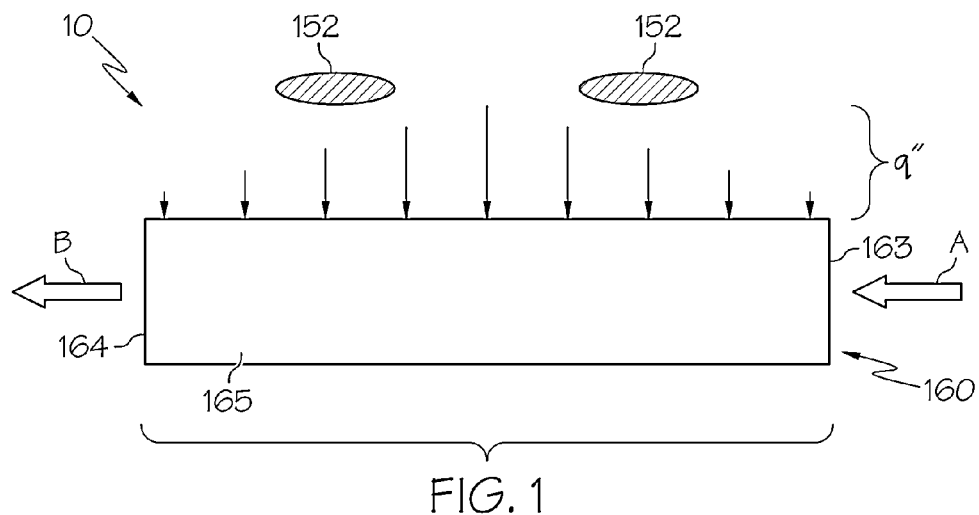
FIG. 1 schematically depicts a magnetic fluid cooling device having a magnetic fluid chamber and two magnetic field generating device according to one or more embodiments shown and described herein.

Referring initially to FIG. 1, a magnetic fluid cooling device 10 according to one embodiment is schematically illustrated. The magnetic fluid cooling device 10 may be coupled to a heat generating device (e.g., a power semiconductor device, a motor, etc.) to remove heat flux q generated by the heat generating device. The magnetic fluid cooling device 10 generally comprises a magnetic fluid chamber assembly 160 that defines a magnetic fluid chamber 165 therein, and one or more magnetic field generating devices 152. The magnetic fluid chamber assembly 160 may include a magnetic fluid inlet 163 and a magnetic fluid outlet 164. Magnetic fluid may enter the magnetic fluid chamber 165 via the magnetic fluid inlet 163, and exit via the magnetic fluid outlet 164. The magnetic field generating devices 152 may be configured in a variety of ways. In one embodiment, the magnetic field generating devices 152 are configured as permanent magnet devices. In another embodiment, the magnetic field generating devices 152 are configured as electromagnetic devices (e.g., electrically conductive coils). Other configurations are also possible.

Figure 2:
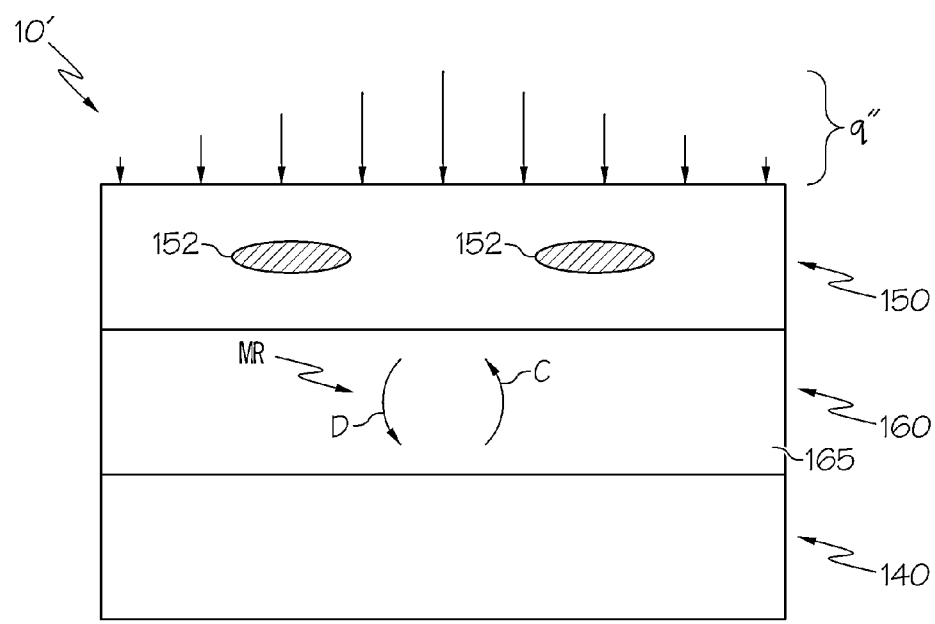
FIG. 2 schematically depicts magnetic fluid circulating within a magnetic fluid chamber according to one or more embodiments shown and described herein.

Referring now to FIG. 2, a magnetic fluid cooling device 10' further comprising a magnetic field substrate 150 and a heat sink device 140 is schematically illustrated. As described in more detail below, the magnetic field generating devices 152 may be embedded within the magnetic field substrate 150. The magnetic field substrate 150 may be thermally coupled to the magnetic fluid chamber assembly 160. In another embodiment, the magnetic field generating devices 152 may be coupled directly to the magnetic fluid chamber assembly 160. The magnetic fluid chamber assembly 160 may also be thermally coupled to the heat sink device 140, which may be configured as any heat sink device that aids in transferring heat flux generated by the heat generating device to the environment.

The magnetic fluid may comprise any liquid that is susceptible to magnetic fields, and is capable of disrupting thermal boundary layers that are formed within the magnetic fluid by the application of the magnetic fields generated by the magnetic field generating devices 152. The magnetic fluid may include, but is not limit to, magneto-rheological fluids, ferrofluids, and liquid metals. The mechanism through which the thermal and magnetic fields are coupled is known as the Curie effect, where the susceptibility, X, of the magnetic fluid increases as a function of its temperature, T. As indicated by arrows C and D, colder magnetic fluid is drawn toward the heat source (i.e., the semiconductor devices 120), while warmer magnetic fluid is pushed away from the heat source, thereby forming enhanced recirculation zones or flows within the magnetic fluid. These enhanced recirculation zones disrupt natural thermal boundary layers that typically form in liquid-cooled packages and improve the removal of heat flux from the heat generating device(s).

Figure 3A:
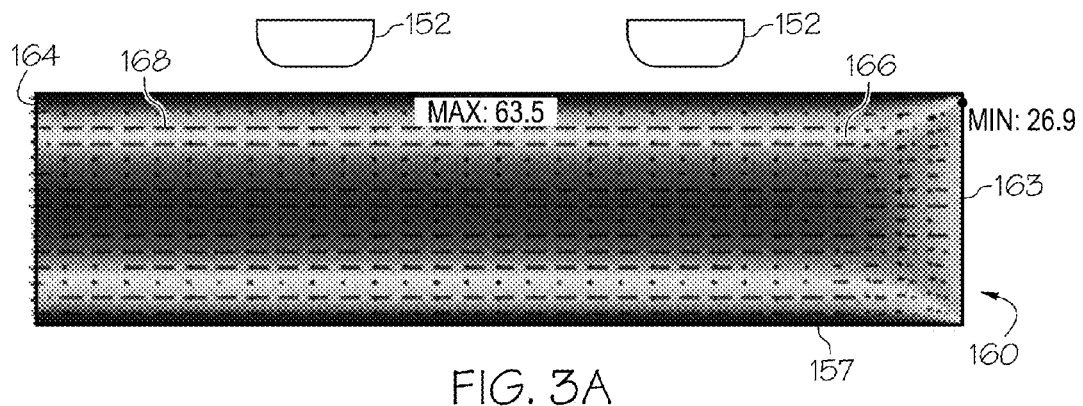
FIG. 3A schematically depicts simulated fluid velocity contours within a simulated magnetic fluid chamber assembly with no magnetic field applied according to one or more embodiments shown and described herein.

FIG. 3A depicts a schematic illustration of simulated fluid velocity contours with velocity vectors 168 within a simulated magnetic fluid chamber assembly 160 as depicted in FIG. 1 and where no magnetic field was applied. Note the development of the traditional fluid boundary layer 166 that inhibits the transfer of heat flux to the magnetic fluid. The maximum temperature was 63.5° C. near the top surface of the magnetic fluid chamber assembly 160 where indicated. The minimum temperature was 26.9° C. near the magnetic fluid inlet 163 where indicated. It should be understood that the simulations of FIGS. 3A, 3B, 5A and 5C are for illustrative purposes only, and that embodiments are not limited to these simulations.

Figure 3B:
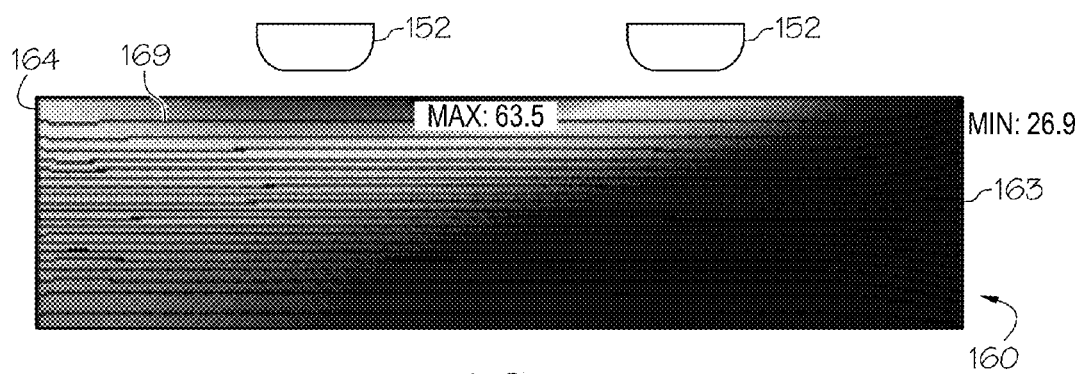
FIG. 3B schematically depicts fluid temperature contours within a simulated magnetic fluid chamber assembly with no magnetic field applied according to one or more embodiments shown and described herein.

FIG. 3B depicts a schematic illustration of fluid temperature contours within the simulated magnetic fluid chamber assembly 160 as depicted in FIG. 1 and where no magnetic field was applied. Note the development of the traditional thermal boundary layer 169, which also inhibits the transfer of heat flux to the magnetic fluid. The local minimum and maximum temperatures are the same as those indicated in FIG. 3A. The average surface temperature of the simulated magnetic fluid chamber assembly 160 was 50.7° C.

Figure 4:
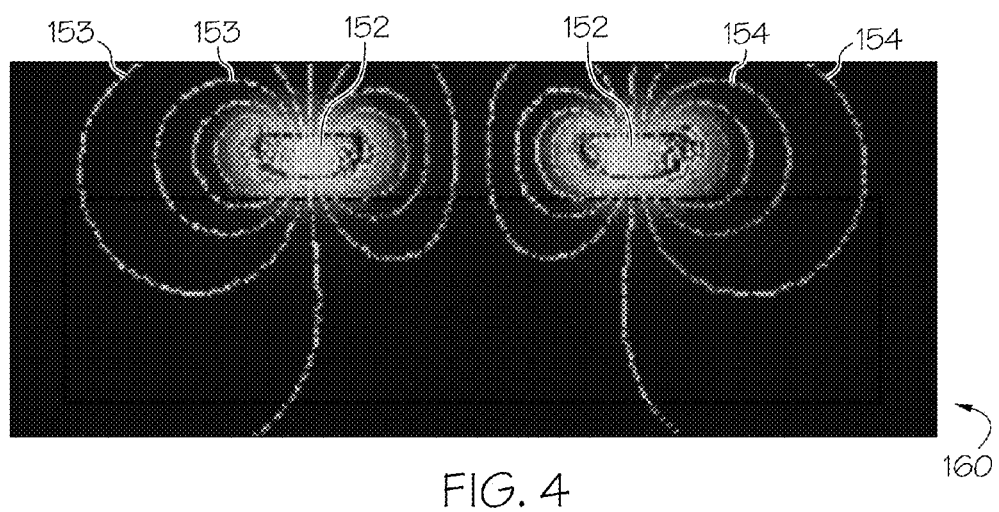
FIG. 4 schematically depicts simulated magnetic fields generated by two magnetic field generating devices according to one or more embodiments shown and described herein.

Referring now to FIG. 4, a schematic illustration of simulated magnetic fields 153, 154 generated by the two magnetic field generating devices 152 is depicted. As stated above, the magnetic field generating devices 152 may be configured in a variety of forms (e.g., permanent magnets, coils, and the like). It should be understood that the simulated magnetic fields 153, 154 are for illustrative purposes only, and that the magnetic fields may take on any shape, strength, polarity, direction, etc. As described below, the magnetic fields 153, 154 may manipulate the flow of the magnetic fluid flowing within the magnetic fluid chamber assembly 160 such that the traditional fluid and thermal boundaries depicted in FIGS. 3A and 3B are disrupted, thereby reducing the thermal resistance of the magnetic fluid chamber assembly 160.

Figure 5A:
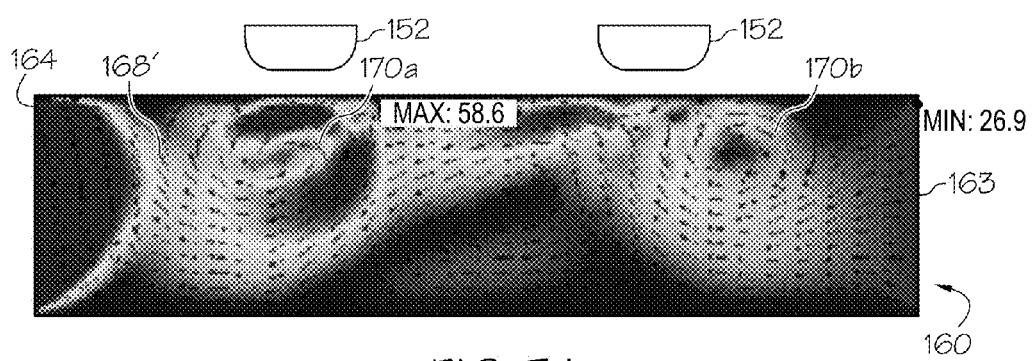
FIG. 5A schematically depicts simulated fluid velocity contours within a simulated magnetic fluid chamber assembly with magnetic field applied according to one or more embodiments shown and described herein.
Figure 5B:
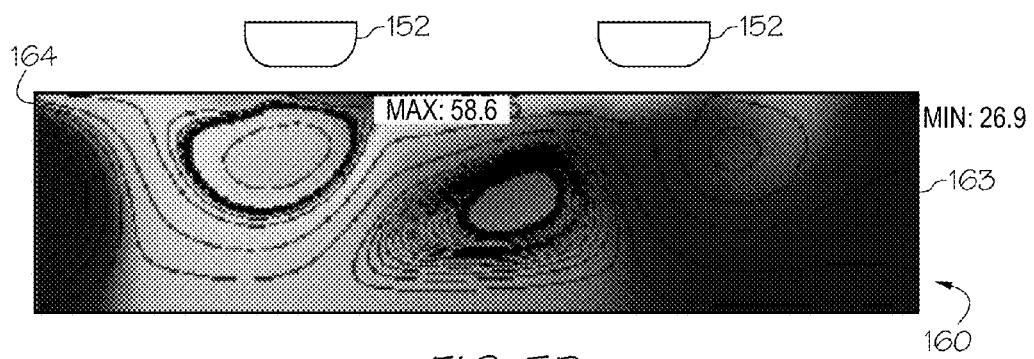
FIG. 5B schematically depicts fluid temperature contours within a simulated magnetic fluid chamber assembly with magnetic fields applied according to one or more embodiments shown and described herein.

FIGS. 5A and 5B depict schematic illustrations of simulated magnetic fluid flow and temperature within a magnetic fluid chamber assembly 160 with the magnetic fields of FIG. 4 applied by the magnetic field generating devices 152. More specifically, FIG. 5A depicts a schematic illustration of fluid velocity contours with velocity vectors 168' in the presence of the magnetic fields 153, 154 illustrated in FIG. 4. As shown in FIG. 5A, the magnetic fields generate fluid recirculation zones 170a, 170b that disrupt the fluid boundary layer due to the magnetic effect (e.g., magneto-rheological effect). The placement of the magnetic field generating devices 152, as well as optimization of the parameters of the magnetic fields that they generate (e.g., polarity, field vectors, etc.) affect the fluid recirculation zones and facilitate the targeted cooling of hot spots generated by the heat flux provided by the heat generating device(s). The maximum temperature was 58.6° C. near the top surface of the magnetic fluid chamber assembly 160 where indicated. The minimum temperature was 26.9° C. near the magnetic fluid inlet 163 where indicated.

FIG. 5B depicts a schematic illustration of fluid temperature contours within magnetic fluid chamber assembly 160 in the presence of the magnetic fields 153, 154 illustrated in FIG. 4. The traditional thermal boundary layer 169 that was present in the simulation depicted in FIG. 3B has been disrupted by the magnetic fields that create the fluid recirculation zones 170a, 170b shown in FIG. 5A. The average surface temperature of the simulated magnetic fluid chamber assembly 160 was 43.2° C. with the magnetic fields 153, 154 present, which is less than 50.7° C. that was calculated with the magnetic fields not present.

It is therefore shown that, by considering the heat flux distribution and strategically placing the magnetic field generating components, the performance of the cooling system may be significantly enhanced. Embodiments may lead to lower device temperatures and increased reliability for electronics systems, such as power semiconductor modules used in power electronics applications.

Figure 6:
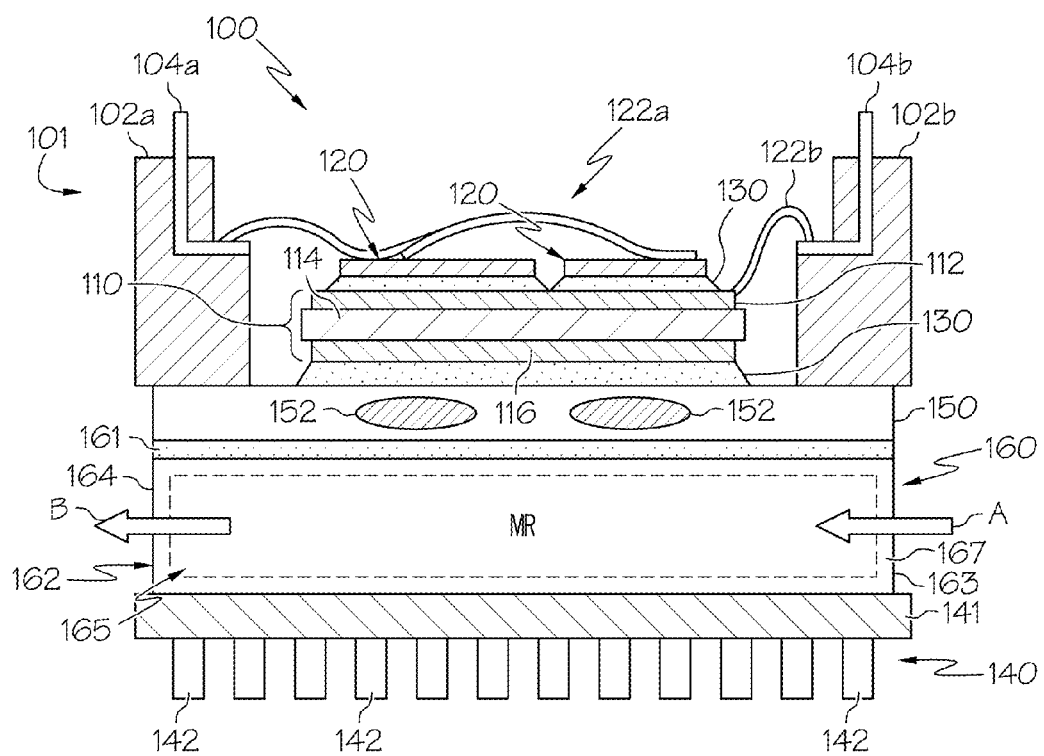
FIG. 6 schematically depicts a power electronics assembly according to one or more embodiments shown and described herein.

Referring now to FIG. 6, one exemplary embodiment of a power electronics assembly 100 is illustrated. It should be understood that embodiments of the present disclosure are not limited to the embodiment depicted in FIG. 6. The power electronics assembly 100 of the illustrated embodiment generally comprises a semiconductor assembly 101, a magnetic field substrate 150, a magnetic fluid chamber assembly 160, and a heat sink device 140, all of which may be configured as separate sub-assemblies, or combined into integrated components. As an example and not a limitation, and as described in more detail below with reference to FIG. 8, the magnetic fluid chamber assembly 160 and the heat sink device 140 may be incorporated into a single device or component in some embodiments to reduce thermal resistance.

In one embodiment, the semiconductor assembly 101 may comprise one or more semiconductor devices 120 thermally coupled to an insulated metal substrate 110. In other embodiments, the semiconductor assembly 101 may not include an insulated metal substrate but may rather comprise one or more semiconductor devices directly bonded to other components of the power electronics assembly 100. For example, in one embodiment, the semiconductor devices 120 may be directly bonded to the magnetic field substrate 150. In another embodiment, the semiconductor devices 120 may be directly bonded to the magnetic field substrate 150 or the heat sink device 140 in embodiments where the magnetic fluid chamber 165 is within the heat sink device 140, as described below.

The insulated metal substrate 110 of the power electronics assembly 100 depicted in FIG. 6 may be a direct bonded copper (DBC) structure, a direct bonded aluminum (DBA) structure, an active metal brazed insulated metal substrate, or other similar power module substrate. The insulated metal substrate 110 may include a first metal layer 112, a thermally conductive dielectric layer 114, and a second metal layer 116. The first and second metal layers 112, 116 are directly bonded to the thermally conductive dielectric layer 114. The first and second metal layers 112, 116 may be made of an electrically conductive metal material (e.g., copper, aluminum, and the like). The thickness of the first and second metal layers 112, 116 may depend on the intended use of the power electronics assembly.

The thermally conductive dielectric layer 114 may be made of an electrically insulative, thermally conductive material such that there is no electrical connection between the first and second metal layers 112, 116. The thermally conductive dielectric layer 114 may comprise a ceramic material, such as alumina ($Al_2O_3$), aluminum nitride (AlN), silicon nitride ($Si_3N_4$), beryllium oxide (BeO), silicon carbide (SiC), and the like. The thermally conductive dielectric layer 114 should be capable of conducting heat flux generated by the semiconductor devices 120 during operation of the power electronics assembly 100 and transferring the heat flux to the second metal layer 116 and the magnetic field substrate 150 as described below. The thickness and size of the thermally conductive dielectric layer 114 may depend on the application in which the power electronics assembly is to operate.

As depicted in FIG. 6, the semiconductor devices 120 may be bonded to the first metal layer 112 of the insulated metal substrate 110 via a bond layer 130. In one embodiment, the bond layer 130 may be a solder layer. In another embodiment, the semiconductor devices 120 are bonded to the first metal layer 112 by braze bonding. Other bonding methods may be utilized. More or fewer semiconductor devices may be attached to the first metal layer 112. The semiconductor devices 120 may be power semiconductor devices such as IGBTs, power diodes, power MOSFETs, power transistors, and the like. In one embodiment, the semiconductor devices of one or more power electronics assemblies are electrically coupled to form an inverter circuit or system for vehicular applications, such as for hybrid vehicles or electric vehicles, for example. In some embodiments, heat generating devices other than power semiconductor devices may be attached to the first metal layer 112.

The semiconductor assembly 101 has a first surface (i.e., a top surface) that may provide for electrical connections to other electrical components/circuits (e.g., an inverter circuit). The semiconductor assembly 101 may also have a second surface (i.e., a bottom surface) that interfaces with the magnetic field substrate 150. For example, the second surface of the semiconductor assembly 101 may be defined by the second metal layer 116 such that the semiconductor assembly 101 may be coupled to the magnetic field substrate 150 at the second metal layer 116. The semiconductor assembly 101 of the illustrated embodiment is directly bonded to a first surface of the magnetic field substrate 150 via a bond layer 130 without any additional interface layers (e.g., additional metal base plates). The semiconductor assembly 101 may be bonded to the magnetic field substrate using a variety of bonding techniques, such as by solder, brazing, or diffusion bonding, for example. However, in an alternative embodiment, one or more thermally conductive interface layers (i.e., heat spreader layers) may be positioned between the second metal layer 116 and the first surface of the magnetic field substrate 150.

Still referring to FIG. 6, the insulated metal substrate 110 may be maintained within a package housing 102, which may be made of a non-electrically conductive material such as plastic, for example. The package housing 102 may be coupled to the cooling structure by a variety of mechanical coupling methods, such as by the use of fasteners or adhesives, for example. Within the module housing may be a first electrical contact 104a and a second electrical contact 104b to provide electrical power connections to the semiconductor devices 120. In the illustrated embodiment, the first electrical contact 104a is electrically coupled to a first surface of the semiconductor devices 120 via a first electrical wire 122a, and the second electrical contact 104b is electrically coupled to a second surface of the semiconductor devices 120 via a second electrical wire 122b and the first metal layer 112 of the insulated metal substrate 110. It should be understood that other electrical and mechanical configurations are possible, and that embodiments are not limited by the arrangement of the components illustrated in the figures.

In the embodiment depicted in FIG. 6, two magnetic field generating devices 152 are embedded within a thermally conductive magnetic field generating substrate 150. The thermally conductive magnetic field generating substrate 150 may be made from any appropriate thermally conductive material. It is noted that embodiments of the present disclosure are not limited to this configuration. For example, in other embodiments the magnetic field device(s) 152 may not be maintained within a substrate but rather individually positioned throughout or within the power electronics assembly (see FIGS. 7 and 8). Further, in an alternative embodiment, the magnetic field substrate 150 may be an integral component of the semiconductor assembly 101. For example, the magnetic field substrate 150 may be provided in one or more layers of the insulated metal substrate 110.

The magnetic field substrate 150 may be coupled to a first surface of the magnetic fluid chamber assembly 160 (e.g., by a solder layer 161) such that the semiconductor devices 120 are thermally coupled to the magnetic fluid chamber assembly 160. The magnetic fluid chamber assembly 160 may define a magnetic fluid chamber 165 within thermally conductive walls 167. Exemplary thermally conductive materials for the thermally conductive walls include, but are not limited to, aluminum, copper, and thermally conductive polymers. The magnetic fluid chamber 165 is configured to accept a magnetic fluid that acts as a coolant fluid by receiving heat flux generated by the semiconductor devices 120.

The magnetic fluid chamber assembly 160 may further comprise a magnetic fluid inlet 163 and a magnetic fluid outlet 164 such that magnetic fluid may enter the magnetic fluid chamber 165 at the magnetic fluid inlet 163 as indicated by arrow A, flow through the magnetic fluid chamber 165, and exit the magnetic fluid chamber 165 at the magnetic fluid outlet 164 as indicate by arrow B. The magnetic fluid inlet 163 and the magnetic fluid outlet 164 may be fluidly coupled to a magnetic fluid reservoir, which may be a component of a coolant recirculation system (e.g., a vehicle coolant system). The magnetic fluid inlet 163 and magnetic fluid outlet may take on any form, such as nozzles, fluid coupling and the like.

In an alternative embodiment, the magnetic fluid chamber assembly may not include a magnetic fluid inlet or a magnetic fluid outlet such that the magnetic fluid chamber is a closed system wherein the magnetic fluid remains within the magnetic fluid chamber. In such an embodiment, the magnetic fields generated by the magnetic field generating devices 152 and the heat flux generated by semiconductor devices 120 create recirculation zones within the magnetic fluid to disrupt natural thermal boundaries that typically form in coolant fluid (see FIGS. 7, 8, 10B-10E).

Still referring to FIG. 6, the second surface of the magnetic fluid chamber assembly 160 may be coupled to a thermal coupling surface 141 of the heat sink device 140. The heat sink device 140 may include a plurality of extending fins 142 to increase surface area of the heat sink device 140 to the environment. The plurality of extending fins 142 may have any number of individual fins of any geometric configuration. Embodiments are not limited to the heat sink device design depicted in FIG. 6 as many other configurations are possible. The second surface of the magnetic fluid chamber assembly 160 may be coupled to the thermal coupling surface of the heat sink device by a variety of means (e.g., soldering, brazing, etc.). As described below, in some embodiments, the magnetic fluid chamber assembly 160 and the heat sink device 140 may be configured as a single, integrated component such that the magnetic fluid chamber 165 is positioned within the heat sink device 140. The thermal resistance of the power electronics assembly of such an embodiment may be reduced by eliminating the thermal resistance between the magnetic fluid chamber assembly 160 and the heat sink device 140.

Figure 7:
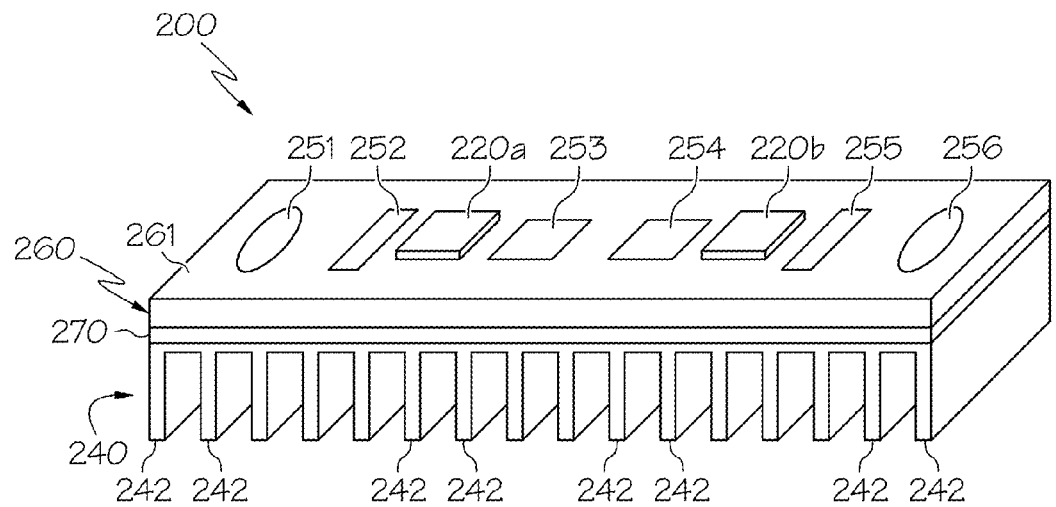
FIG. 7 schematically depicts a power electronics assembly according to one or more embodiments shown and described herein.

Referring now to FIG. 7, another embodiment of a power electronics assembly 200 is schematically illustrated. In this embodiment, the semiconductor assembly comprises individual semiconductor devices 220a, 220b that are directly bonded to a top surface 261 of a magnetic fluid chamber assembly 260. It is noted that the semiconductor devices 220a, 220b may include the insulated metal substrate assembly described above with respect to the power electronics assembly 100 schematically illustrated in FIG. 6 in some embodiments. The exemplary power electronics assembly 200 further comprises a heat spreader 270 that is positioned between the magnetic fluid chamber assembly 260 and a heat sink device 240 having a plurality of extending fins 242.

The magnetic fluid chamber assembly 260 defines an internal, closed magnetic fluid chamber (not visible in FIG. 7). In an alternative embodiment, the magnetic fluid chamber may include a magnetic fluid input and a magnetic fluid output to provide for an open system. As described above with respect to the embodiment schematically illustrated in FIG. 6, the magnetic fluid chamber assembly 260 may be made of a thermally conductive material, such as aluminum, copper, and the like.

In the illustrated embodiment, magnetic field generating devices 251-256 are coupled to the top surface 261 of the magnetic fluid chamber assembly 260. The semiconductor devices 220a, 220b may be positioned between two magnetic field generating devices (e.g., semiconductor device 220a is positioned between magnetic field generating devices 252 and 253, and semiconductor device 220b is positioned between magnetic field generating devices 254 and 255). It should be understood that embodiments may include any number of semiconductor devices and any number of magnetic field generating devices. Further, embodiments are not limited to the arrangement of the magnetic field generating devices 251-256 and the semiconductor devices 220a, 220b depicted in FIG. 7.

As shown in FIG. 7, the magnetic field generating devices 251-256 may be configured as having a variety of geometric shapes. The geometric shape(s) of the magnetic field generating devices may correspond to the desired shape of the magnetic fields that are generated to manipulate the magnetic fluid within the magnetic fluid chamber. Embodiments are not limited to the geometric shapes and orientations of the magnetic field generating devices 251-256 depicted in FIG. 7.

The heat spreader 270 may be made of any appropriate thermally conductive material, such as aluminum or copper, for example. The magnetic fluid chamber assembly 260, the heat spreader 270 and the heat sink device 240 may be coupled together by a variety of methods (e.g., solder, brazing, etc.).

Figure 8:
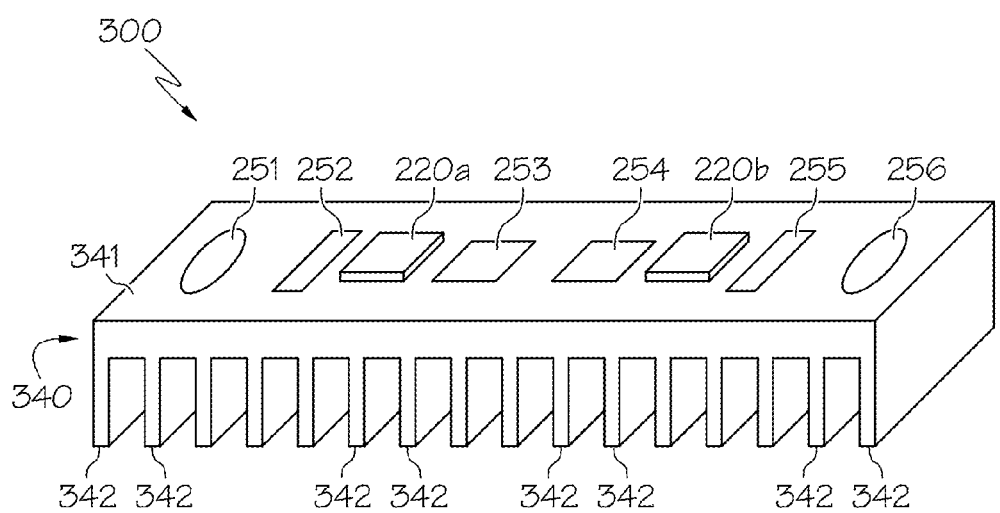
FIG. 8 schematically depicts a power electronics assembly having a heat sink with an integral magnetic fluid chamber according to one or more embodiments shown and described herein.

FIG. 8 schematically illustrates an embodiment of a power electronics assembly 300 in which the magnetic fluid chamber (not shown) is within the heat sink device 340. Removing the separate magnetic fluid chamber assembly from the power electronics assembly 300 reduces the overall thermal resistance of the assembly. The heat sink device 340 comprises a plurality of extending fins 342 that may be configured in any pattern. The semiconductor devices 220a, 220b and the magnetic field generating devices 251-256 may be configured and coupled to the thermal coupling surface 341 of the heat sink device 340 as described above and illustrated in FIG. 7.

Figure 9A:
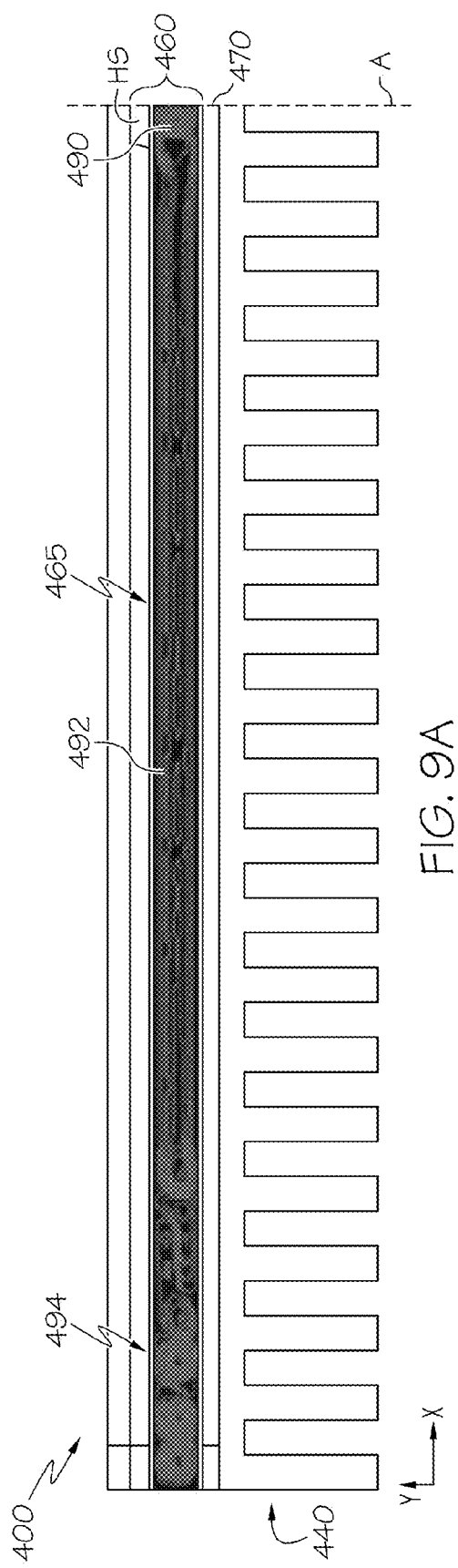
FIG. 9A schematically depicts an internal view of a power electronics assembly showing simulated fluid recirculation zones within a closed magnetic fluid chamber according to one or more embodiments shown and described herein.

The magnetic field patterns generated by the magnetic field generating devices may be designed to produce particular fluid recirculation zones at desired locations within the magnetic fluid chamber to optimally remove heat from the heat generating device. FIG. 9A depicts a cross-sectional schematic view of a power electronics assembly 400 showing simulated fluid recirculation zones 490, 492, and 494 within a closed magnetic fluid chamber 465. The power electronics assembly comprises a magnetic fluid chamber assembly 460, a heat spreader 470 and a heat sink device 440, similar to the power electronics assembly 200 depicted in FIG. 7. Dashed line A represents a symmetry line of the exemplary power electronics assembly 400. The heat flux generated by a simulated heat source HS (e.g., a power semiconductor device) and magnetic field patterns generated by the magnetic heat generating devices (not shown) create a small recirculation zone 490 near the heat source HS, an elongated recirculation zone 492 that transfers fluid to the ends of the magnetic fluid chamber 465, and several smaller recirculation zones 494 near the end of the magnetic fluid chamber 465. The height of the magnetic fluid chamber 465 may also be optimized to create desired recirculation zones.

Figure 9B:
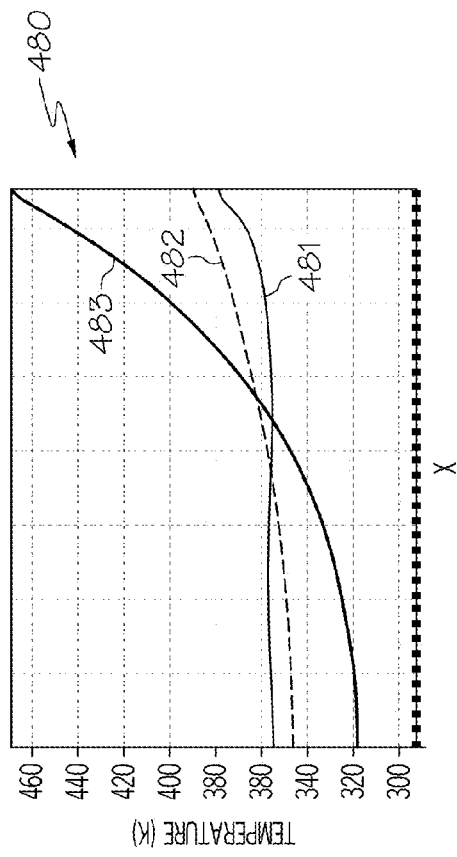
FIG. 9B graphically depicts simulated temperature distribution of the power electronics assembly simulated in FIG. 9A as well as simulated temperature distributions for a power electronics assembly with a heat spreader only, and a power electronics assembly with no heat spreader and no magnetic fluid chamber assembly, according to one or more embodiments shown and described herein.

FIG. 9B graphically illustrates simulated temperature distributions along the x-axis of the power electronics assembly 400 depicted in FIG. 9A (curve 481), a power electronics assembly device with a heat sink device and an aluminum heat spreader (curve 482), and a heat sink device with no heat spreader or magnetic field chamber assembly (curve 483). Parameters for the simulation include a heat source HS located near the middle of the magnetic fluid chamber 465 producing 1000 W/m; a magnetic fluid having a thermal conductivity k of 2.7 W/m·K, a density $\rho$ of 1060 kg/m$^3$, and a heat capacity $C_P$ of 3000 J/kg·K; an aluminum heat spreader 470 having a thermal conductivity k of 160 W/m·K, a density $\rho$ of 2700 kg/m$^3$, and a heat capacity $C_P$ of 900 J/kg·K; and a heat sink device 440 having a heat transfer rate q of −100(T−293.15). As shown in FIG. 9B, the power electronics assembly 400 outperforms the assemblies indicated by curves 482 and 483.

As stated above, the placement and configuration of the magnetic field generating devices may be optimized to create desired magnetic field patterns. In one embodiment, the arrangement and magnetization of individual magnetic field generating devices may be such that the magnetic field generating device(s) create a Halbach array, wherein a first side of the magnetic field generating devices produce a strong magnetic flux (i.e., the side of the magnetic field generating device that is toward the magnetic fluid chamber), and the magnetic flux on a second side is inhibited by cancellation. FIG. 10A schematically illustrates a magnetic field generating device 451 configured as magnetic regions having alternating magnetization directions. Region 495a has a magnetization direction in a positive y-direction, which is followed by region 496a having a magnetization direction in a positive x-direction, which is then followed by region 495b having a magnetization direction in a negative y-direction, which is then followed by region 496b having a magnetization direction in a negative x-direction, and so on. The magnetic flux generated by the individual magnetic regions cancel above the magnetic field generating device 451, while the magnetic flux 453, 454 below the magnetic field generating device 451 is enhanced toward the magnetic field chamber by constructive interference.

Figure 10C:
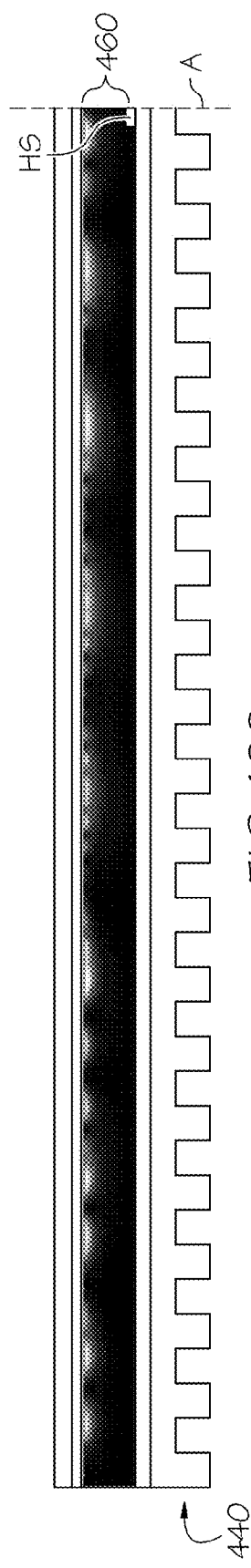
FIG. 10C schematically depicts a fluid body force distribution of magnetic fluid resulting from the simulated magnetic field distribution illustrated in FIG. 10B according to one or more embodiments shown and described herein.
Figure 10D:
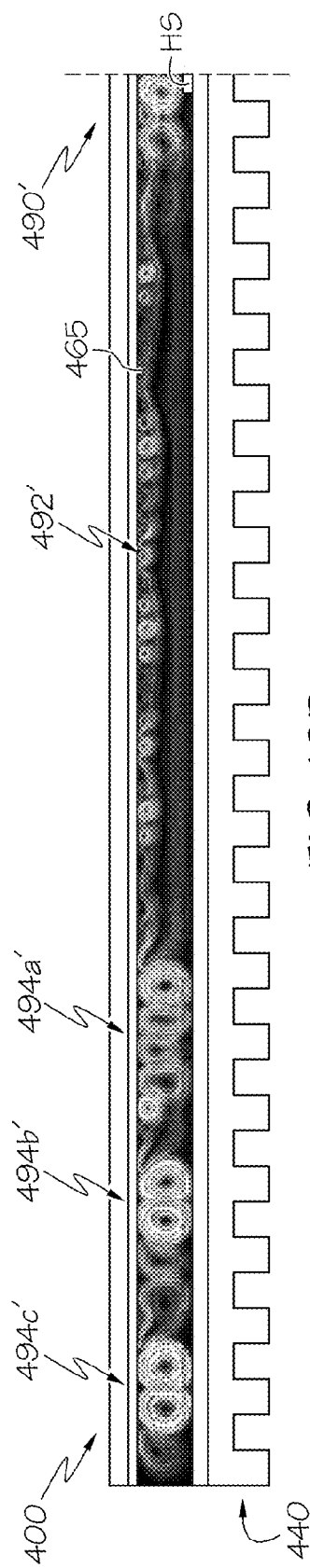
FIG. 10D schematically depicts a simulated magnetic fluid streamline within a magnetic fluid chamber resulting from the simulations of FIGS. 10B and 10C according to one or more embodiments shown and described herein.
Figure 10E:
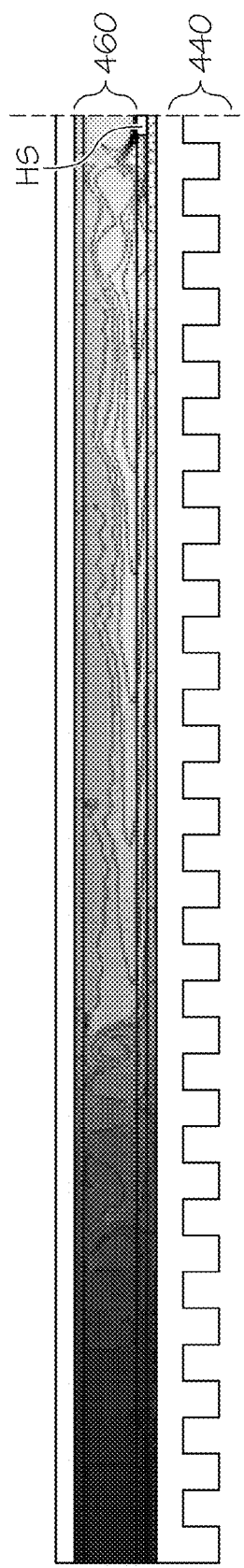
FIG. 10E schematically depicts a simulated temperature distribution within a magnetic fluid chamber resulting from the simulations of FIGS. 10B-10D.

FIG. 10B illustrates a simulated magnetic field distribution (shown as magnetic flux lines 453, 454) of magnetic field generating devices as described above with respect to FIG. 10A applied to a heat sink device 440 and a magnetic fluid chamber assembly 460 having a heat source HS applied thereto. The magnetic flux is primarily within the magnetic fluid chamber assembly 460 due to the Halbach array effect described above. FIG. 10C illustrates simulated a fluid body force distribution of the magnetic fluid within the magnetic fluid chamber assembly 460. As described above, the magnetic fluid is affected by the magnetic flux generated by the magnetic field generating devices. The lighter regions represent increased fluid force. FIG. 10D illustrates a simulated magnetic fluid streamline within the magnetic fluid chamber 465. Similar to FIG. 9A, the magnetic fluid experiences several recirculation zones, including a first recirculation zone 490' near the heat source HS, an elongated recirculation zone 492', and several recirculation zones indicated by reference numerals 494a'-494c'. FIG. 10E illustrates a simulated temperature profile of the power electronics assembly simulated in FIGS. 10B-10D, wherein the lighter regions represent a warmer temperature and the darker regions represent a cooler temperature.

It should now be understood that embodiments described herein may be utilized to cool heat generating devices by use of magnetic fields and magnetic fluid. More specifically, power electronics assemblies may incorporate an open or closed liquid cooling assembly having one or more magnetic field generating devices and magnetic fluid to disrupt fluid and thermal boundary layers within a magnetic fluid chamber, thereby enhancing heat transfer and lowering the temperature of the heat generating device. In some embodiments, the magnetic field generating devices may be configured to produce a Halbach array to generate magnetic flux within the magnetic fluid chamber.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A magnetic fluid cooling device comprising:
a magnetic field generating device configured to generate a magnetic field, wherein the magnetic field generating device comprises a plurality of magnetic regions having alternating magnetic directions such that magnetic flux generated by the magnetic field generating device is enhanced on a first side of the magnetic field generating device and inhibited on a second side of the magnetic field generating device;
a magnetic fluid chamber assembly, wherein:
the magnetic fluid chamber assembly defines a magnetic fluid chamber;
the magnetic fluid chamber comprises a plurality of walls and is configured to accept a magnetic fluid such that the magnetic fluid flows within the magnetic fluid chamber; and
the first side of the magnetic field generating device is coupled to the magnetic fluid chamber assembly; and
a heat sink device comprising a plurality of extending fins, wherein the heat sink device is thermally coupled to the magnetic fluid chamber assembly,
wherein the magnetic field generating device is positioned and configured such that the magnetic field generated by the magnetic field generating device manipulates a flow of the magnetic fluid within the magnetic fluid chamber by thermo-magnetic convection, so that an enhanced fluid recirculation zone of the magnetic fluid is created within the magnetic fluid chamber assembly and disrupts a natural thermal boundary within the magnetic fluid chamber resulting from a heat flux applied to the magnetic fluid chamber assembly.

2. The magnetic fluid cooling device of claim 1, further comprising a heat generating device coupled to the magnetic fluid chamber assembly.

3. The magnetic fluid cooling device of claim 2, wherein the heat generating device comprises a semiconductor device.

4. A power electronics assembly comprising:
a semiconductor assembly comprising a semiconductor device;
a magnetic field generating device configured to generate a magnetic field;
a magnetic fluid chamber assembly, wherein:
the magnetic fluid chamber assembly defines a magnetic fluid chamber;
the magnetic fluid chamber comprises a plurality of walls and is configured to accept a magnetic fluid such that the magnetic fluid flows within the magnetic fluid chamber; and
the magnetic fluid chamber assembly is thermally coupled to the semiconductor assembly; and
a heat sink device comprising a plurality of extending fins, wherein the heat sink device is thermally coupled to the magnetic fluid chamber assembly,
wherein the magnetic field generating device is positioned and configured such that the magnetic field generated by the magnetic field generating device manipulates a flow of the magnetic fluid within the magnetic fluid chamber by thermo-magnetic convection, so that an enhanced fluid recirculation zone of the magnetic fluid is created within the magnetic fluid chamber assembly and disrupts a natural thermal boundary within the magnetic fluid chamber resulting from a heat flux applied to the magnetic fluid chamber assembly.

5. The power electronics assembly of claim 4, wherein the magnetic field generating device and the semiconductor device are positioned in a same plane.

6. The power electronics assembly of claim 4, wherein the magnetic field generating device is offset with respect to the semiconductor device along a plane parallel to the semiconductor assembly.

7. The power electronics assembly of claim 4, wherein the magnetic field generating device comprises a permanent magnet or an electromagnetic device.

8. The power electronics assembly of claim 4, further comprising a magnetic field substrate having a first surface and a second surface, wherein:
the magnetic field generating device is surrounded the magnetic field substrate;
the semiconductor assembly is coupled to the first surface of the magnetic field substrate; and
the magnetic fluid chamber assembly is coupled to the second surface of the magnetic field substrate.

9. The power electronics assembly of claim 8, wherein:
the magnetic fluid chamber assembly comprises a first surface and a second surface;
the semiconductor assembly is coupled to the first surface of the magnetic field substrate by a first brazing layer; and
the second surface of the magnetic field substrate is coupled to the first surface of the magnetic fluid chamber assembly by a second brazing layer.

10. The power electronics assembly of claim 4, wherein the magnetic fluid chamber assembly further comprises a magnetic fluid inlet and a magnetic fluid outlet, and the magnetic fluid chamber is configured to accept the magnetic fluid from the magnetic fluid inlet such that the magnetic fluid flows through the magnetic fluid chamber and exits at the magnetic fluid outlet.

11. The power electronics assembly of claim 4, wherein the magnetic field generating device alters a polarity and one or more field vectors of the magnetic field to align the fluid recirculation zone of the magnetic fluid with one or more hot spots of the heat generating device.

12. The power electronics assembly of claim 4, wherein the magnetic fluid chamber assembly is an integral component of the heat sink device.

13. The power electronics assembly of claim 12, wherein the semiconductor assembly and the magnetic field generating device are coupled to a thermal coupling surface of the heat sink device.

14. The power electronics assembly of claim 4, wherein the semiconductor assembly comprises one or more additional semiconductor devices and one or more additional magnetic field generating devices.

15. The power electronics assembly of claim 14, wherein the one or more additional magnetic field generating devices have a shape that is different from a shape of the magnetic field generating device.

16. The power electronics assembly of claim 4, wherein the magnetic field generating device is configured as a Halbach array.

17. The power electronics assembly of claim 4, further comprising a heat spreader comprising a first surface and a second surface, wherein:
the magnetic fluid chamber assembly comprises a first surface and a second surface;

the semiconductor assembly and the magnetic field generating device are coupled to the first surface of the magnetic fluid chamber assembly;

the second surface of the magnetic fluid chamber assembly is coupled to the first surface of the heat spreader; and the second surface of the heat spreader is coupled to a thermal coupling surface of the heat sink device.

18. A power electronics assembly comprising:

a semiconductor assembly comprising a semiconductor device;

a magnetic field generating device configured to generate a magnetic field;

a heat sink device comprising a magnetic fluid chamber, a thermal coupling surface, and a plurality of extending fins, wherein:

the magnetic fluid chamber comprises a plurality of walls and is configured to accept a magnetic fluid such that the magnetic fluid flows within the magnetic fluid chamber;

the semiconductor assembly is thermally coupled to the heat sink device; and the magnetic field generating device is positioned and configured such that the magnetic field generated by the magnetic field generating device manipulates a flow of the magnetic fluid within the magnetic fluid chamber by thermo-magnetic convection, so that an enhanced fluid recirculation zone of the magnetic fluid is created within the magnetic fluid chamber assembly and disrupts a natural thermal boundary within the magnetic fluid chamber resulting from a heat flux applied to the magnetic fluid chamber assembly.

19. The power electronics assembly of claim 18, further comprising a magnetic field substrate having a first surface and a second surface, wherein:

the magnetic field generating device is surrounded by the magnetic field substrate;

the semiconductor assembly is coupled to the first surface of the magnetic field substrate; and the second surface of the magnetic field substrate is coupled to the thermal coupling surface of the heat sink device.

20. The power electronics assembly of claim 18, wherein the semiconductor assembly and the magnetic field generating device are coupled to the thermal coupling surface.

* * * * *

UNITED STATES PATENT AND TRADEMARK OFFICE
CERTIFICATE OF CORRECTION

PATENT NO. : 8,730,674 B2  
APPLICATION NO. : 13/316954  
DATED : May 20, 2014  
INVENTOR(S) : Dede et al.

Page 1 of 1

It is certified that error appears in the above-identified patent and that said Letters Patent is hereby corrected as shown below:

In the Claims

Claim 8, column 12, line 17, "surrounded the" is hereby changed to "surrounded by the".

Signed and Sealed this  
Fifth Day of August, 2014

Michelle K. Lee  
*Deputy Director of the United States Patent and Trademark Office*